United States Patent
Mai et al.

(10) Patent No.: US 8,158,513 B2
(45) Date of Patent: Apr. 17, 2012

(54) INTEGRATED CIRCUIT SYSTEM EMPLOYING BACKSIDE ENERGY SOURCE FOR ELECTRICAL CONTACT FORMATION

(75) Inventors: Zhihong Mai, Singapore (SG); Suey Li Toh, Singapore (SG); Pik Kee Tan, Singapore (SG); Jeffrey C. Lam, Singapore (SG); Liang-Choo Hsia, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 31 days.

(21) Appl. No.: 12/247,479

(22) Filed: Oct. 8, 2008

(65) Prior Publication Data

US 2010/0087061 A1    Apr. 8, 2010

(51) Int. Cl.
*H01L 21/44* (2006.01)
(52) U.S. Cl. .............. 438/662; 438/664; 257/E21.199

(58) Field of Classification Search .......... 438/660–662; 257/E21.199
See application file for complete search history.

(56) References Cited

U.S. PATENT DOCUMENTS

| | | | |
|---|---|---|---|
| 6,110,813 A * | 8/2000 | Ota et al. ............... | 438/597 |
| 6,420,264 B1 * | 7/2002 | Talwar et al. .............. | 438/682 |
| 6,695,455 B1 | 2/2004 | Su | |
| 6,864,142 B1 * | 3/2005 | Conn .................... | 438/293 |
| 7,384,729 B2 | 6/2008 | Fu et al. | |
| 2003/0006414 A1 * | 1/2003 | Takemura et al. ........... | 257/72 |
| 2005/0250319 A1 * | 11/2005 | Carruthers et al. ........ | 438/655 |
| 2007/0287266 A1 | 12/2007 | Chung et al. | |
| 2008/0076226 A1 * | 3/2008 | Knutson et al. ............ | 438/308 |

* cited by examiner

*Primary Examiner* — Thanhha Pham
(74) *Attorney, Agent, or Firm* — Mikio Ishimaru

(57) ABSTRACT

A method for manufacturing an integrated circuit system includes: providing a first material; forming a second material over a first side of the first material; and exposing a second side of the first material to an energy source to form an electrical contact at an interface of the first material and the second material.

20 Claims, 2 Drawing Sheets

INTEGRATED CIRCUIT SYSTEM EMPLOYING BACKSIDE ENERGY SOURCE FOR ELECTRICAL CONTACT FORMATION

TECHNICAL FIELD

The present invention relates generally to integrated circuits, and more particularly to a system for an integrated circuit system employing a backside energy source for electrical contact formation.

BACKGROUND ART

Integrated circuits are used in many portable electronic products, such as cell phones, portable computers, voice recorders, etc., as well as in many larger electronic systems, such as cars, planes, industrial control systems, etc. Integrated circuits may include a combination of active devices, passive devices and their interconnections.

Electrical interconnections for current 65 nm and 45 nm integrated circuits commonly employ silicide or salicide interfaces to reduce their electrical contact resistance. Generally, these silicide or salicide interfaces are formed via a rapid thermal annealing (RTA) process, which utilizes transient lamp heating to create a uniform temperature distribution in the microstructures across the wafer. Unfortunately, RTA processes generally only allow for the adjustment of horizontal temperature profiles across a wafer and they are unable to control the temperature profile in the vertical direction on the wafers. This imprecise temperature control causes undesirable refractory metal diffusion effects that form defective metal silicides. Typical metal silicide defects include spiking, piping, and refractory metal or metal silicide residue left on top of a spacer, which can lead to a poly-contact short.

In the latest wafer processing technology, laser annealing techniques have been developed to lessen the occurrence of undesirable refractory metal diffusion. For example, pulsed laser techniques have been employed because of their improved ability to control the thermal diffusion length of dopants, making it a desirable tool for shallow junction processes. However, conventional laser annealing of wafers is typically carried out from the front-side of the wafer, and the metal layer blocks the laser irradiation, thereby preventing direct heating at a metal/silicon interface. As a result, it is difficult to control the temperature profile at the metal/silicon interface during a laser silicidation process.

Thus, a need still remains for a reliable integrated circuit system and method of fabrication, wherein the integrated circuit system exhibits reduced defective metal silicide occurrences and/or an improved temperature profile at the metal/silicon interface. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for manufacturing an integrated circuit system including: providing a first material; forming a second material over a first side of the first material; and exposing a second side of the first material to an energy source to form an electrical contact at an interface of the first material and the second material.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
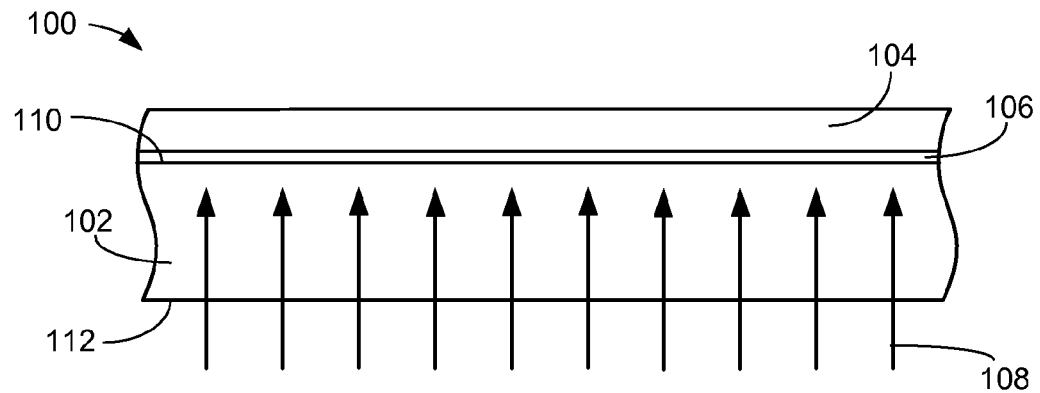
FIG. 1 is a partial cross sectional view of a portion of an integrated circuit system in accordance with an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGS. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

The term "on" is used herein to mean there is direct contact among elements.

The terms "example" or "exemplary" are used herein to mean serving as an instance or illustration. Any aspect or embodiment described herein as an "example" or as "exemplary" is not necessarily to be construed as preferred or advantageous over other aspects or designs.

The term "layer" encompasses both the singular and the plural unless otherwise indicated.

The terms "first" and "second" as used herein are for purposes of differentiation between elements only and are not to be construed as limiting the scope of the present invention.

The term "exhibiting the characteristics of stress memorization" as used herein includes a structure or element that has its physical properties affected by a stress memorization layer.

The term "system" as used herein means and refers to the method and to the apparatus of the present invention in accordance with the context in which the term is used.

Generally, the following embodiments relate to an energy source, such as pulsed laser irradiation source, transmitted from the backside of a wafer to control the temperature distribution over the microstructures formed over, in, or on the wafer. The method, system, and/or device of the present embodiments permits reduced diffusion of a refractory metal within a substrate, enhanced control over the formation of refractory metal spiking/diffusion into well regions, enhanced control over the formation of refractory metal piping into the gate area of a device, and prevention of the formation of modified refractory metal materials on the top of a spacer during silicidation.

Figure 2:
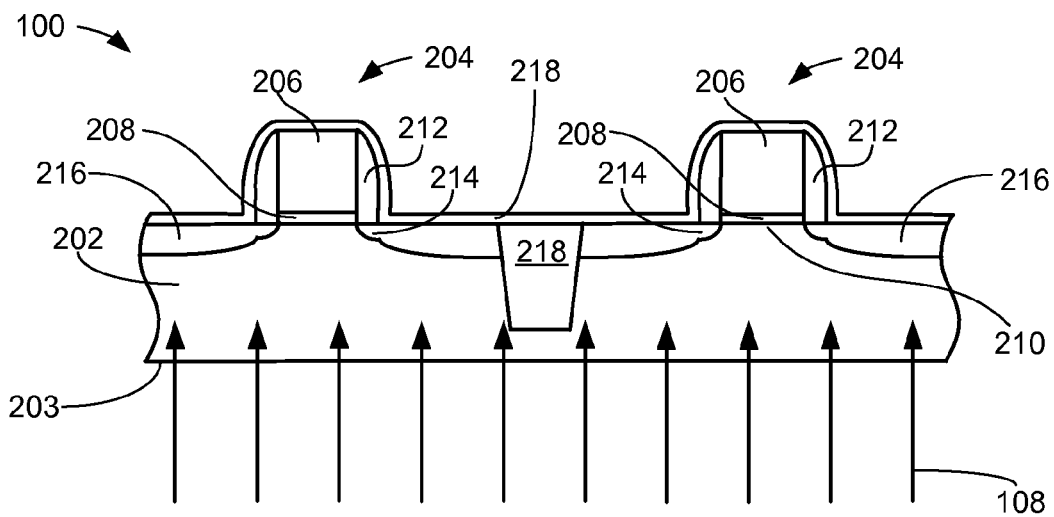
FIG. 2 is a partial cross sectional view of an integrated circuit system in accordance with an embodiment of the present invention.
Figure 3:
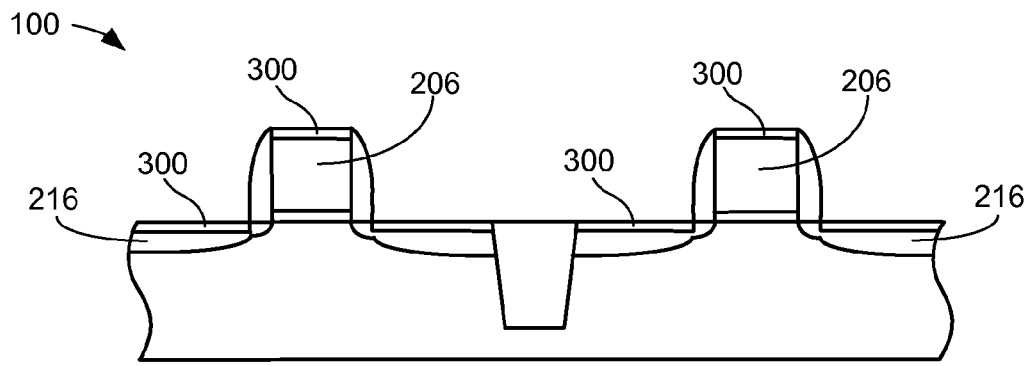
FIG. 3 is the structure of FIG. 2 after further processing.

FIGS. 1-3, which follow, depict by way of example and not by limitation, an exemplary process for the formation of an integrated circuit system and they are not to be construed as limiting. It is to be understood that a plurality of conventional processes that are well known within the art and not repeated herein, may precede or follow FIGS. 1-3. Moreover, it is to be understood that many modifications, additions, and/or omissions may be made to the below described process without departing from the scope of the claimed subject matter. For example, the below described process may include more, fewer, or other steps. Additionally, steps may be performed in any suitable order without departing from the scope of the present invention.

Moreover, it is to be appreciated that the integrated circuit system of the present disclosure may include any number of multi-electrode devices (e.g., active device structures) in which the current flowing between two specified electrodes is controlled or modulated by the voltage applied at a control electrode. Exemplary illustrations may include a bipolar junction transistor (BJT), an n-channel metal-oxide semiconductor (NMOS), a p-channel metal-oxide semiconductor (PMOS), a complementary metal-oxide semiconductor (CMOS) configuration, a single-gate transistor, a multi-gate transistor, a fin-field effect transistor (fin-FET), or an annular gate transistor. Furthermore, it is to be understood that one or more of the integrated circuit system could be prepared at one time on a medium, which could be separated into individual or multiple integrated circuit assemblies at a later stage of fabrication.

Furthermore, although some of the present embodiments will be described herein in the context of an active device, it will be appreciated by those skilled in the art that a passive device requiring silicide contacts could be simply substituted, and that the techniques and aspects of the present embodiments will similarly apply to the alternative embodiment.

Moreover, it will be appreciated by those skilled in the art that the techniques of the present embodiments can be used to fabricate an integrated circuit system, for example, an active device, using existing conventional NMOS, PMOS, and CMOS compatible process technology, thereby minimizing or reducing the cost of manufacturing.

Moreover, it is to be understood that the integrated circuit system manufactured by the embodiments described herein can be used within processor components, memory components, logic components, digital components, analog components, mixed-signal components, power components, radio-frequency (RF) components (e.g., RF CMOS circuits), digital signal processor components, micro-electromechanical components, optical sensor components, and so forth, in numerous configurations and arrangements as may be needed.

Referring now to FIG. 1, therein is shown a partial cross sectional view of a portion of an integrated circuit system 100 in accordance with an embodiment of the present invention.

In general, this portion of the integrated circuit system 100 may include a first material 102, a second material 104, an interface 106, and an energy source 108. Per the present embodiments, the first material 102, such as a substrate 202 of FIG. 2, may be defined as any material that absorbs heat from the second material 104 upon exposure to the energy source 108, and the second material 104, such as a metal layer 218 of FIG. 2, may be defined as any material that emits heat to the first material 102 upon exposure to the energy source 108. For example, it will be appreciated by those skilled in the art that the optical properties of the first material 102 and the second material 104 can be strategically chosen to ensure a temperature rise of the second material 104 at the interface 106 that is higher than that of the first material 102, thereby generating a temperature barrier for salicidation formation.

Generally, the second material 104 can be formed over a first side 110 of the first material 102. By forming the second material 104 over the first material 102, the energy source 108 can be introduced to the interface 106 between the first material 102 and the second material 104 from a second side 112 of the first material 102. In one embodiment, the second side 112 can be formed opposite the first side 110.

The present inventors have discovered that by introducing the energy source 108 from the second side 112, the temperature profile at the interface 106 can be controlled down to the nanometer range as determined by the following equation:

$$L = [4Dt]^{1/2}$$

wherein L equals the thermal diffusion length, D is the thermal diffusivity, and t is the pulse width of the energy source 108. It is to be understood that the thermal diffusivity of the first material 102 can vary with the crystalline orientation and doping concentration, for example. Moreover, as the diffusivity of a compound or element varies with the temperature, it will be appreciated by those skilled in the art that the temperature gradient and the thermal diffusion length can vary with the power, pulse width (t) or dwell time of the energy source 108.

By introducing the energy source 108 from the second side 112, the transparent or semi-transparent nature of the first material 102 permits the energy source 108 to impart its energy dissipation (e.g., heating effect) upon the second material 104. Accordingly, the method and/or system of the present embodiments permits a highly localized heating at the interface 106.

The present inventors have also discovered that by strategically controlling the thermal diffusion length (L) of the second material 104, a natural temperature barrier is also formed that helps to control the formation of a low resistance electrical contact (e.g., a silicide or a salicide) between the first material 102 and the second material 104. Empirical data gathered by the present inventors demonstrates a highly controllable vertical temperature profile from the second material 104 to the first material 102 that forms a natural temperature barrier (e.g., due to the temperature difference between the first material 102 and the second material 104), thereby controlling and/or modulating the diffusion of the second material 104 into undesirable locations in vertical structures.

Generally, the energy source 108 may include any form of electromagnetic radiation that possesses a high transmissivity through the first material 102, while exhibiting low reflectivity and high absorption upon encountering the second material 104. In one embodiment, the energy source 108 may include a form of energy with a wavelength that exceeds approximately 1 micrometer. In other embodiments, the energy source 108 may include a gas laser (e.g., a carbon dioxide ($CO_2$) laser) with a wavelength of about 10.5 micrometers. Moreover, it will be appreciated by those skilled in the art that a multitude of process parameters, e.g., power, scanning speed, focus adjustment, pulse width, etc., regardless of the energy source 108 employed can be manipulated to effectuate the purpose of passing through the first material 102 to thereby impart its energy upon the second material 104.

As an exemplary illustration, in one embodiment such as a CMOS structure fabricated over or on a silicon wafer, the energy source 108 may include a $CO_2$ laser and/or a solid state laser (e.g., Nd:YAG laser), wherein the energy source 108 has been strategically chosen to match the optical properties of the material within the integrated circuit system 100. For example, a silicon form of the first material 102 within the integrated circuit system 100 may possess good optical transmissivity for light with a wavelength greater than 1 um and $SiO_2$/SiN type materials within the integrated circuit system 100 may possess good optical transmissivity for light with a wavelength less than 3 um. In another exemplary illustration, such as blanket wafers or salicidation of simple silicon/metal structures, a $CO_2$ laser may be preferred as the energy source 108. In yet another exemplary illustration, such as patterned silicon wafers or silicon-on-insulator wafers, a solid state laser may be preferred as the energy source 108 because of its wavelength (e.g., between about 1 micrometer to about 3 micrometers).

It will be appreciated by those skilled in the art that some forms of the energy source 108 are less desirable because they may exhibit high reflection and low absorption upon the second material 104. For example, depending upon the type of material chosen for the first material 102 and the second material 104, sub-millimeter wave radiation, microwave radiation, and radio-frequency radiation may be less desirable.

Moreover, it will be appreciated by those skilled in the art that the strategic use and choice of the energy source 108 permits reduced diffusion of a metal within a wafer, enhanced control over the formation of metal spiking/diffusion into well regions, enhanced control over the formation of metal piping into the gate area of a device, and prevention of the formation of modified refractory metal materials on the top of a spacer during silicidation.

Referring now to FIG. 2, therein is shown a partial cross sectional view of the integrated circuit system 100 in accordance with an embodiment of the present invention.

In some embodiments, the integrated circuit system 100 may include the substrate 202, such as a two hundred (200) mm or three hundred (300) mm semiconductor wafer upon which any number of active and/or passive device structures and their interconnections could be formed. In such cases, a multitude of different regions (e.g., memory, logic, high voltage, etc.) can be formed over, on and/or within the substrate 202 for the manufacture of active and/or passive device structures by conventional deposition, patterning, photolithography, and etching techniques known in the semiconductor processing industry.

In general, the substrate 202, such as the first material 102, of FIG. 1, may include any material that is transparent or semi-transparent (e.g., possesses a sufficiently large energy gap) to the energy source 108 transmitted from a backside 203 of the substrate 202. By way of example, the substrate 202 may include a silicon material, as well as silicon-on-insulator (SOI) configurations. However, it will be appreciated by those skilled in the art that the thickness of the insulator layer within an SOI configuration may affect the transmissivity of the energy source 108 through the substrate 202.

Additionally, the substrate 202 may also include doped and undoped configurations, epitaxial layers, strained configurations, and one or more crystalline orientations (e.g., <100>, <110>, and/or <111> orientations), which may be strategically employed to optimize carrier mobility within NMOS, PMOS and/or CMOS devices. The substrate 202 may also include a material that becomes amorphous upon implantation.

In some embodiments, the substrate 202 may possess a thickness ranging from about one hundred (100) nanometers to about several hundred microns, for example.

However, the examples provided for the substrate 202 are not to be construed as limiting and the composition of the substrate 202 may include any surface, material, configuration, or thickness that physically and electrically enables the formation of active and/or passive device structures while being transparent or semi-transparent to the energy source 108.

Additionally, prior to forming any subsequent layers over the substrate 202, it is to be understood that the substrate 202 may undergo a cleaning step to remove surface contaminants, such as particles, mobile ionic contaminants, organics and native oxides.

In some embodiments, the integrated circuit system 100 may include one or more of an active device 204. In such cases, the active device 204 may more particularly include NMOS devices, PMOS devices and/or a combination thereof (i.e., CMOS devices), for example. However, it is to be understood that the active device 204 is not limited to the preceding examples and may include any number of multi-electrode devices in which the current flowing between two specified electrodes is controlled or modulated by the voltage applied at a control electrode.

In general, the active device 204 may include a gate 206, a gate dielectric 208, a channel 210, a spacer 212, a source/drain extension 214, a source/drain 216, the metal layer 218, and an isolation structure 220.

In some embodiments, the gate 206 may be formed from conventional materials including doped and undoped semiconducting materials (such as, for example, crystalline Si, polySi, amorphous Si, or SiGe), a metal, a metallic alloy, a silicide, or a combination thereof, for example. In another embodiment, the gate 206 may also include any material that is transparent or semi-transparent to the energy source 108 while permitting electrical conduction. The gate dielectric 208 may be made from materials including, but not limited to, silicon oxide, silicon oxynitride, silicon nitride, a silicon oxide/nitride/oxide stack, a high-k dielectric material (i.e., one having a dielectric constant value greater than silicon oxide), an insulation material that is transparent or semi-transparent to the energy source 108, or a combination thereof. However, it is to be understood that the type of material chosen for the gate dielectric 208 is not limited to the above examples; for example, the gate dielectric 208 may include any material (e.g., transparent or non-transparent to the energy source 108) that permits induction of a charge in the channel 210 when an appropriate voltage is applied to the gate 206. Accordingly, other materials, which may be known to those skilled in the art for gate structures, may also be used for the gate 206 and the gate dielectric 208.

Generally, the thickness of the gate 206 is between about 300 angstroms and about 3000 angstroms and the thickness of the gate dielectric 208 is between about 15 angstroms and about 50 angstroms. However, larger or smaller thicknesses of the gate 206 and the gate dielectric 208 may be appropriate depending on the design specifications of the active device 204. Nonetheless, in some embodiments, the thickness of the gate dielectric 208 should not exceed the wavelength of the energy source 108.

The spacer 212 can be made from dielectric materials such as an oxide, a nitride, or a combination thereof (e.g., a multi-layer structure), but preferably includes silicon dioxide. The spacer 212 can be formed by a variety of techniques, including, but not limited to, chemical vapor deposition, physical vapor deposition and thermal oxidation.

In some embodiments, the spacer 212 can be formed by oxidation of the gate 206 material, followed by removal of the oxide from over the substrate 202, thereby forming the spacer 212. However, it is to be understood that the type of materials and method chosen for the formation of the spacer 212 is not limited to the above examples and may include any material and method that permits the formation of a gate sidewall structure that electrically isolates the gate 206.

In other embodiments, the spacer 212 may include any stressor material, such as a stress memorization material/layer, that transfers its inherent or intrinsic stress to the gate 206, the channel 210, the source/drain extension 214, and/or the source/drain 216 during an anneal step. In general, when the spacer 212 includes the characteristics of a stress memorization layer, the spacer 212 can transfer its intrinsic stress to the active device 204 upon recrystallization of the amorphous regions within the active device 204. By way of example, the spacer 212 may include a compressively stressed layer or a tensile stressed layer.

In yet other embodiments, the spacer 212 can be transparent, semi-transparent, or opaque to the energy source 108, thereby permitting varying levels of control for the transmission of the energy source 108.

Generally, the spacer 212 may include a thickness ranging from about 20 angstroms to about 200 angstroms. However, it is to be understood that the thickness of the spacer 212 may vary with the design specifications of the active device 204. For example, the thickness of the spacer 212 may vary with the desired placement of an electrical contact 300, of FIG. 3, over the source/drain 216 and its resultant proximity effects upon the channel 210 of the active device 204.

The active device 204 may also include the source/drain extension 214 and the source/drain 216 formed adjacent the gate 206. In general, the source/drain extension 214 may be formed to a shallow depth with a low concentration of impurities relative to the source/drain 216. The impurities used to form the source/drain extension 214 may include n-type or p-type, depending on the active device 204 being formed (e.g., n-type impurities for an NMOS device and p-type impurities for a PMOS device). It is to be understood that the source/drain extension 214 can be formed by aligning the source/drain extension 214 to the gate 206 (i.e., before forming the spacer 212) or subsequent to forming the spacer 212 by employing an angled implant.

In some embodiments the source/drain 216 can be aligned to the spacer 212. In general, the source/drain 216 may be of the same conductivity type as the dopants used to form the source/drain extension 214 (e.g., n-type impurities for an NMOS device and p-type impurities for a PMOS device). In general, the source/drain 216 may be formed to a deeper depth and with a higher concentration of impurities (e.g., a heavy dose source and drain implant) relative to the source/drain extension 214.

In yet other embodiments, the implant energy used to form the source/drain 216 may possess sufficient energy to amorphize at least a portion of the substrate 202 and/or at least a portion of the gate 206 of the active device 204. An implant with sufficient energy to amorphize at least a portion of the substrate 202 and/or at least a portion of the gate 206 allows a subsequent anneal step to transfer/memorize a stress to the gate 206 and to the source/drain 216 during recrystallization, thereby promoting stress within the channel 210 and improving the performance of the active device 204.

In yet other embodiments, the source/drain 216 may also include a strained semiconductor material that provides a further increase in the strain upon the channel 210. For example, a strained version of the source/drain 216 could be formed by etching a recess adjacent to the gate 206 and/or the spacer 212, and depositing within that recess a strained silicon/germanium material, which may then provide a significant strain upon the channel 210.

The metal layer 218 can be formed over the entirety or on selected portions of the integrated circuit system 100, e.g., blanket deposited over or on the substrate 202, the spacer 212, and the gate 206. In general, the metal layer 218 can be formed by a variety of techniques, including, but not limited to, chemical vapor deposition and/or physical vapor deposition.

Generally, the metal layer 218, such as the second material 104, of FIG. 1, may include any conductive material that experiences a larger increase in temperature than the substrate 202 when the energy source 108 is cast upon the backside 203. In at least one embodiment, the metal layer 218 may include any conducting compound that forms an electrical interface between itself and another material that is thermally stable and provides uniform electrical properties with low resistance. In other embodiments, the metal layer 218 may more specifically include refractory metal materials such as, nickel (Ni), tantalum (Ta), cobalt (Co), titanium (Ti), tungsten (W), platinum (Pt), or molybdenum (Mo).

It is to be understood that upon exposure to the energy source 108, the metal layer 218 can form an electrical contact, which may include a low resistance silicide or salicide electrical contact, formed over the gate 206 and/or the source/drain 216. It will be appreciated by those skilled in the art that a silicide electrical contact can affect the mobility of carriers within the channel 210 of the active device 204. For example, in some embodiments, if the electrical contact is placed close to the channel 210, the electrical contact can positively or negatively affect the mobility of carriers within the channel 210. Accordingly, it is to be understood that the thickness of the spacer 212 can be modulated (e.g., by increasing or decreasing the thickness) to reduce or increase the effect that the electrical contact can have on carrier mobility within the channel 210.

The isolation structure 220, which may include a shallow trench isolation structure, a local oxidation of silicon structure, and/or other suitable isolation features, can electrically isolate and/or separate the active device 204 from other structures. In some embodiments, the isolation structure 220 can be made from a dielectric material such as silicon oxide, silicon nitride, or silicon oxynitride. In other embodiments, the isolation structure 220 may also include a multi-layer structure of one or more dielectric materials. In yet other embodiments, the isolation structure 220 may include any material that is transparent or semi-transparent to the energy source 108.

Referring now to FIG. 3, therein is shown the structure of FIG. 2 after further processing. Generally, after exposing the metal layer 218, of FIG. 2, to the energy source 108, of FIG. 2, the metal layer 218 formed over the source/drain 216 and the gate 206 can be converted to the electrical contact 300, such as a low resistance silicide or salicide contact. The remaining portions of the metal layer 218 not converted to the electrical contact 300 are removed from over the integrated circuit system 100 by an etching process well known within the art and not repeated herein. It will be appreciated by those skilled in the art that a stress memorization layer or a stressed etch stop layer may also be formed over the integrated circuit system 100 to further induce stress within the integrated circuit system 100.

Figure 4:
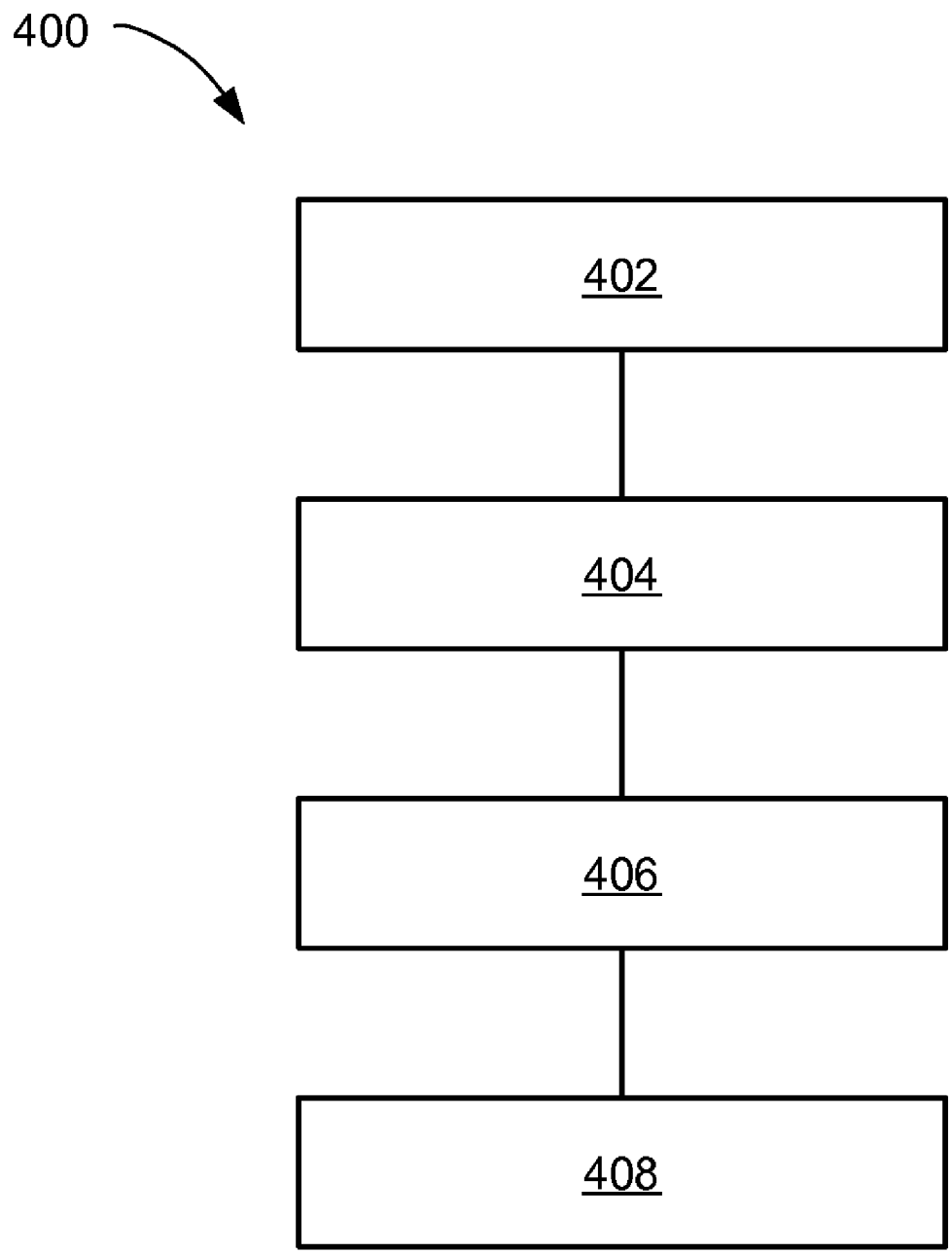
FIG. 4 is a flow chart of a method for manufacturing an integrated circuit system in accordance with an embodiment of the present invention.

Referring now to FIG. 4, therein is shown a flow chart of a method for manufacturing an integrated circuit system 400 for the integrated circuit system 100 in accordance with an embodiment of the present invention. The integrated circuit system 400 includes providing a first material in a block 402; forming a second material over a first side of the first material in a block 404; and exposing a second side of the first material to an energy source to form an electrical contact at an interface of the first material and the second material in a block 406.

It has been discovered that the present invention thus has numerous aspects. One such aspect is that the present invention exhibits enhanced control over the formation of an electrical contact, such as a low resistance silicide or salicide electrical contact, while helping to prevent spiking or diffusion of the electrical contact into the well region of an electronic device.

Another aspect is that the present invention exhibits enhanced control over the formation of an electrical contact, such as a low resistance silicide or salicide electrical contact, while helping to prevent piping of the electrical contact into the gate area of an electronic device.

Another aspect is that the present invention exhibits enhanced control over the formation of an electrical contact, such as a low resistance silicide or salicide electrical contact, while helping to prevent the formation of modified refractory metal materials on the top of a spacer during silicidation, which can cause poly-contact shorts.

In yet another aspect, the method, system, and/or device of the present invention helps to strategically control the temperature at the interface of a silicide or salicide contact with a substrate by employing an energy source transmitted through the substrate.

In yet another aspect, the method, system, and/or device of the present invention helps to strategically control the thermal diffusion length of the materials involved in the silicidation process by employing an energy source transmitted through the substrate.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit system of the present invention furnishes important and heretofore unknown and unavailable solutions, capabilities, and functional aspects for reducing defective metal silicide occurrences and/or improving temperature profile at a metal/silicon interface. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit system comprising:
   providing a first material;
   forming a second material over a first side of the first material; and
   exposing a second side of the first material to an energy source to raise a temperature of the second material higher than a temperature of the first material and to form an electrical contact at an interface of the first material and the second material, the energy source including a pulsed laser for controlling spiking or piping.

2. The method as claimed in claim 1 wherein:
   providing the first material includes providing a material with transparent or semi-transparent properties to the energy source.

3. The method as claimed in claim 1 wherein:
   forming the second material includes forming a metal layer.

4. The method as claimed in claim 1 wherein:
   exposing the second side of the first material to the pulsed laser controls the diffusion of the second material by controlling the vertical temperature profile from the second material to the first material.

5. The method as claimed in claim 1 wherein:
   exposing the second side of the first material to the energy source to form the electrical contact includes forming a silicide contact or a salicide contact.

6. A method for manufacturing an integrated circuit system comprising:
   providing a substrate;
   forming a metal layer over the substrate; and
   exposing a backside of the substrate to an energy source to raise a temperature of the metal layer higher than a temperature of the substrate and to form an electrical contact, the energy source including a pulsed laser for controlling spiking or piping.

7. The method as claimed in claim 6 wherein:
   providing the substrate includes providing a silicon material.

8. The method as claimed in claim 6 wherein:
   forming the metal layer over the substrate includes forming a refractory metal.

9. The method as claimed in claim 6 wherein:
   exposing the backside of the substrate to the energy source includes using a form of energy with a wavelength exceeding approximately 1 micrometer.

10. The method as claimed in claim 6 wherein:
    exposing the backside of the substrate to the energy source to form the electrical contact includes forming the electrical contact over a source/drain.

11. A method for manufacturing an integrated circuit system comprising:
- providing a substrate including an active device;
- forming a metal layer over the substrate and the active device; and
- exposing a backside of the substrate to an energy source to raise a temperature of the metal layer higher than a temperature of the substrate to form an electrical contact, the energy source including a pulsed laser for controlling spiking or piping.

12. The method as claimed in claim 11 wherein:
providing the active device includes providing an NMOS device.

13. The method as claimed in claim 11 wherein:
providing the active device includes providing a PMOS device.

14. The method as claimed in claim 11 wherein:
providing the active device includes providing a CMOS device.

15. The method as claimed in claim 11 wherein:
providing the substrate includes the use of silicon.

16. The method as claimed in claim 11 wherein:
forming the metal layer includes forming a nickel layer.

17. The method as claimed in claim 11 wherein:
exposing the backside of the substrate to the energy source includes using a carbon dioxide pulsed laser.

18. The method as claimed in claim 11 wherein:
exposing the backside of the substrate to the energy source to form the electrical contact includes forming the electrical contact over a source/drain.

19. The method as claimed in claim 11 wherein:
exposing the backside of the substrate to the energy source to form the electrical contact includes forming a silicide contact or a salicide contact.

20. The method as claimed in claim 11 wherein:
exposing the backside of the substrate to the energy source helps to prevent forming a metal residue on a spacer.

* * * * *